United States Patent
Groff

(10) Patent No.: US 6,473,593 B1
(45) Date of Patent: Oct. 29, 2002

(54) MULTIPLE CHANNEL UPCONVERTER HAVING ADJACENT CHANNEL OUTPUT AND METHOD OF IMPLEMENTING THE SAME

(75) Inventor: Donald E. Groff, Hatfield, PA (US)

(73) Assignee: General Instruments Corporation, Horsham, PA (US)

( * ) Notice: Subject to any disclaimer, the term of this patent is extended or adjusted under 35 U.S.C. 154(b) by 0 days.

(21) Appl. No.: 09/466,888

(22) Filed: Dec. 20, 1999

(51) Int. Cl.[7] .................................................. H04H 1/00
(52) U.S. Cl. ...................... 455/3.01; 348/725; 725/131; 455/112; 455/118
(58) Field of Search ................................. 455/3.01, 3.5, 455/463, 112, 118; 348/724, 725, 731; 725/131

(56) References Cited

U.S. PATENT DOCUMENTS

| | | | |
|---|---|---|---|
| 5,390,346 A | 2/1995 | Marz | 455/260 |
| 6,115,363 A | * 9/2000 | Oberhammer et al. | 455/314 |
| 6,377,315 B1 | * 4/2002 | Carr et al. | 455/179.1 |

FOREIGN PATENT DOCUMENTS

WO 98/09438 3/1998

OTHER PUBLICATIONS

International Preliminary Examination Report, dated Nov. 22, 2001.

* cited by examiner

*Primary Examiner*—Thanh Congle
*Assistant Examiner*—Thuan T. Nguyen
(74) *Attorney, Agent, or Firm*—Rader, Fishman, & Grauer PLLC

(57) ABSTRACT

An upconverter unit for a cable television system upconverts multiple channel signals from a common intermediate frequency to a VHF or UHF signal ready for transmission to subscribers. The two-stage upconverter provides a first stage in which different channel signals are upconverted to different frequencies which are spaced apart by same frequency difference characteristic of different channels in the cable system. A second stage of the upconverter uses a common oscillator signal to convert the various channel signals from the first stage to the frequencies at which they will be transmitted over the cable system.

21 Claims, 3 Drawing Sheets

# MULTIPLE CHANNEL UPCONVERTER HAVING ADJACENT CHANNEL OUTPUT AND METHOD OF IMPLEMENTING THE SAME

FIELD OF THE INVENTION

The present invention relates to the field of video broadcasting, particularly in a cable television system. More specifically, the present invention relates to an improved, multiple channel upconverter for upconverting television signals to an appropriate transmission frequency prior to transmission, e.g., over a cable television system.

BACKGROUND OF THE INVENTION

Cable television systems allow subscribers access to dozens or even hundreds of channels of television programming. This wide variety of programming accounts for the great popularity of cable television. Additionally, the current trend is for cable television systems to provide additional services such as premium channels, pay-per-view programming, video-on-demand programming and even internet access. Providing video-on-demand programming, in which the subscriber can request transmission of a program, e.g., a movie, at any time, places particular burdens on the operation of a cable television system.

In a conventional cable television system, a cable television signal is transmitted from a central facility known as a headend. The signal from the headend travels over the cable television network to the homes or offices of individual subscribers where it is received and used. Typically, each subscriber will have a set-top terminal, a box of electronic equipment, through which the cable television signal is processed after being received through a co-axial cable wall outlet. The set-top terminal is connected to the subscriber's television set and provides the cable television signal to the television for use by the subscriber. In advanced cable systems, the set-top terminal can also signal or send messages "upstream" to the headend. Consequently, such a terminal can be used by the subscriber to electronically order a video-on-demand program directly from the headend.

Cable television signals are typically generated at an intermediate (IF) frequency that is unsuitable for transmission over the cable television network. Consequently, a device called an upconverter is used at the headend to upconvert the intermediate frequency signal to a signal in the very high frequency (VHF) or ultra high frequency (UHF) range suitable for transmission over the cable television system.

Conventionally, a separate upconverter is required at the headend for each television channel being transmitted over the cable system. Additionally, upconverter units are commonly built and sold as composite units that contain two independent upconverters. Thus, one upconverter unit may include two independent upconverting circuits and handle two of the channels of the cable television system.

In a simple upconversion technique, an incoming baseband or IF signal is multiplied in a mixer with a signal produced by a local oscillator, e.g., a carrier signal. The resulting output of the mixer is an upconverted output signal that occupies a desired VHF or UHF channel or frequency band. Typically, a filter is used to pass one sideband of the mixing process that falls within the desired VHF or UHF channel or frequency band, and to block any undesired sidebands or an oscillator signal at the output of the mixer from being transmitted.

The problem with this single mixer upconverter is that generally at least one of the upper and lower sidebands and the oscillator signal fall within the higher VHF or UHF channel. As a result, a special bandpass filter is needed to just pass, for example, the upper sideband signal and reject the lower sideband and oscillator signal. Alternatively, a well-known tracking filter can be used that only tracks the desired output signal. Both of the special bandpass and tracking filters are difficult and expensive to implement.

These problems can be overcome by implementing a two-stage upconverting technique with appropriate intervening filtering. As shown in FIG. 1, a basic two-stage upconverter includes two local oscillators, two mixing stages and appropriate intervening filters.

The input signal (106) is an intermediate frequency signal, typically 41 to 47 MHz. After filtering with a filter (101), the input IF signal is input to the first-stage mixer (102). The mixer (102) also receives a signal (110) from an oscillator (108). The mixer (102) multiplies the incoming IF signal (106) with the signal (110) from the oscillator (108) to produce a high intermediate frequency signal. Generally, the signal (110) output by the oscillator (108) is fixed as to its frequency. The oscillator (108) may, however, be able to accept and make small adjustments in the output frequency of the signal (110).

The mixed signal is output to a filter (103) and then provided to a second-stage mixer (104). The second-stage mixer (104) mixes the signal output by the first-stage with a signal (111) output by a second-stage oscillator (109). In this way, the second-stage mixer (104) converts the signal down to the appropriate frequency, VHF or UHF, at which it will be transmitted. This frequency will be different for each channel.

Consequently, the second-stage oscillator (109) should be controllable to output a signal (111) over the wide range of VHF and UHF channel frequencies, e.g., 50 to 1000 MHz, as needed. As illustrated in FIG. 1, a wide range voltage controlled oscillator (109) may be used for this purpose. This allows the system operator to set the upconverter shown in FIG. 1 to upconvert a television signal for any desired channel in the cable system. As noted above, a different upconverter is used for each channel.

The output of the second-stage mixer (104) may be filtered again in the filter (105). The result is an output signal (107) in the VHF or UHF range that is ready for transmission over the cable system. The output signal (107) created in this way is cleaner than those available from a one-stage upconverter.

A more advanced two-stage upconverter is described in U.S. Pat. No. 5,390,346, issued Feb. 14, 1995 to Daniel J. Marz of General Instrument Corporation. This upconverter is illustrated in FIG. 2. As shown in FIG. 2, the first and second-stage oscillators illustrated in FIG. 1 are replaced by oscillator synthesizers (201, 202). These synthesizers (201, 202) use a phase looked loop to synthesize the output of an oscillator, i.e., oscillating signals (110, 111). A reference signal (204, 205) is provided respectively to each oscillator synthesizer (201, 202) to which the phase of the output signal is locked by the phase looked loop circuitry of the synthesizer (201, 202).

Both the synthesizers are wide range synthesizers that can be controlled to output oscillating signals (110, 111) at any desired frequency over the VHF and UHF ranges, i.e., 50 to 1000 MHz. A control means (203) is provided to control the frequency of the output signal of the synthesizers (201, 202).

An expensive aspect of prior art upconverters, such as those described above, resides in the requirements placed on the second-stage oscillator and oscillator synthesizer. Because the second-stage oscillator determines the frequency and, therefore, the television channel, on which the output signal (107) will be transmitted, the second-stage oscillator must be able to output a signal (111) at any one of many closely located frequencies over the extremely broad range of the VHF and UHF bands. This is required to allow the cable system operator to use the upconverter for any desired channel. However, placing these demands on the second-stage oscillator increases it costs and can degrade its performance.

These limitations on prior art upconverters are exacerbated in the video-on-demand field. With video-on-demand, essentially a separate channel is used to provide the programming requested by the subscriber at the time the subscriber requests it. Thus, a separate upconverter is used to supply each program requested by a subscriber through a video-on-demand service. Consequently, as the number of upconverters increases to meet subscriber demand, the cost of each upconverter and the space if requires at the headend facility limit the ability of the cable system operator to expand the video-on-demand service.

Therefore, there is a need in the art for an upconverter and method of implementing the same that can more economically provide for upconversion of television signals in a cable network, particularly for video-on-demand service.

SUMMARY OF THE INVENTION

It is an object of the present invention to meet the above-described needs and others. Specifically, it is an object of the present invention to provide an upconverter and method of implementing the same that can more economically provide for upconversion of television signals in a cable network, particularly for video-on-demand service.

Additional objects, advantages and novel features of the invention will be set forth in the description which follows or may be learned by those skilled in the art through reading these materials or practicing the invention. The objects and advantages of the invention may be achieved through the means recited in the attached claims.

To achieve these stated and other objects, the present invention may be embodied and described as a multiple-channel, two stage upconverter for processing television channel signals prior to broadcast in a cable television system. The first stage separates the frequencies of the channel signals so that those frequencies are spaced by the same frequency separation used between channels broadcast in the cable television system. The second stage then converts the channel signals to the frequencies for the desired channels in the VHF or UHF bands on which the signals will actually be broadcast. Consequently, the second-stage oscillator determines on which channels in the cable system the channel signals will be broadcast.

The upconverter of the present invention may be characterized by a number of inputs for receiving a corresponding number of channel signals at an intermediate frequency, a first converting stage and a second converting stage. Each of the two stages will be described in more detail below.

The first converting stage includes a number of mixers and oscillators with one mixer and oscillator being associated with and receiving each of the channel signals from the channel signal inputs. Each of the first-stage oscillators output an oscillator signal having a frequency different from the other oscillator signals output by the other first-stage oscillators. Preferably, the oscillator signals output by the first-stage oscillators have frequencies that are spaced apart by an amount equal to the frequency spacing between different channels in the cable television system. Each oscillator signal is mixed by an associated mixer with one of the channel signals. Preferably, the intermediate frequency of the channel signals, when received by the inputs for the first stage, is the same frequency for all of the channel signals.

In the second stage, the channel signals from the first stage are received and further processed. The second stage includes a number of second-stage mixers, each of which receives one of the channel signals from the first stage. Each of the second-stage mixers mixes a received channel signal with a second-stage oscillator signal output by a single second-stage oscillator that is connected in common to each of the second-stage mixers.

Band bass filtering and amplification of the channel signals may be performed before the channel signals are input to the first stage, between the first and second stages and after the channel signals are output by the second stage. Preferably, any such filtering and amplification stage includes a number of band pass filters each of which serves to filter one of the channel signals at a particular frequency to which that channel signal is provided or has been converted by the preceding converting stage.

After being processed by the second stage, the channel signals are combined by a combiner into a composite signal for broadcast over the cable television system. The upconverter of the present invention is particularly suited for video-on-demand services in which a number of channel signals can readily be upconverted and broadcast on a contiguous group of channels.

The present invention also encompasses the method of implementing the upconverter described above. For example, the present invention include the method of upconverting multiple television channel signals using a two stage technique prior to broadcast of the channel signals in a cable television system by, in a first stage, mixing each of the channel signals with one of a number of oscillator signals, where each of the oscillator signals has a frequency different than the other oscillator signals; and in a second stage, mixing each of the channel signals individually with a common second-stage oscillator signal.

BRIEF DESCRIPTION OF THE DRAWINGS

The accompanying drawings illustrate the present invention and are a part of the specification. Together with the following description, the drawings demonstrate and explain the principles of the present invention.

DETAILED DESCRIPTION OF THE PREFERRED EMBODIMENTS

Using the drawings, the preferred embodiments of the present invention will now be explained.

Figure 1:
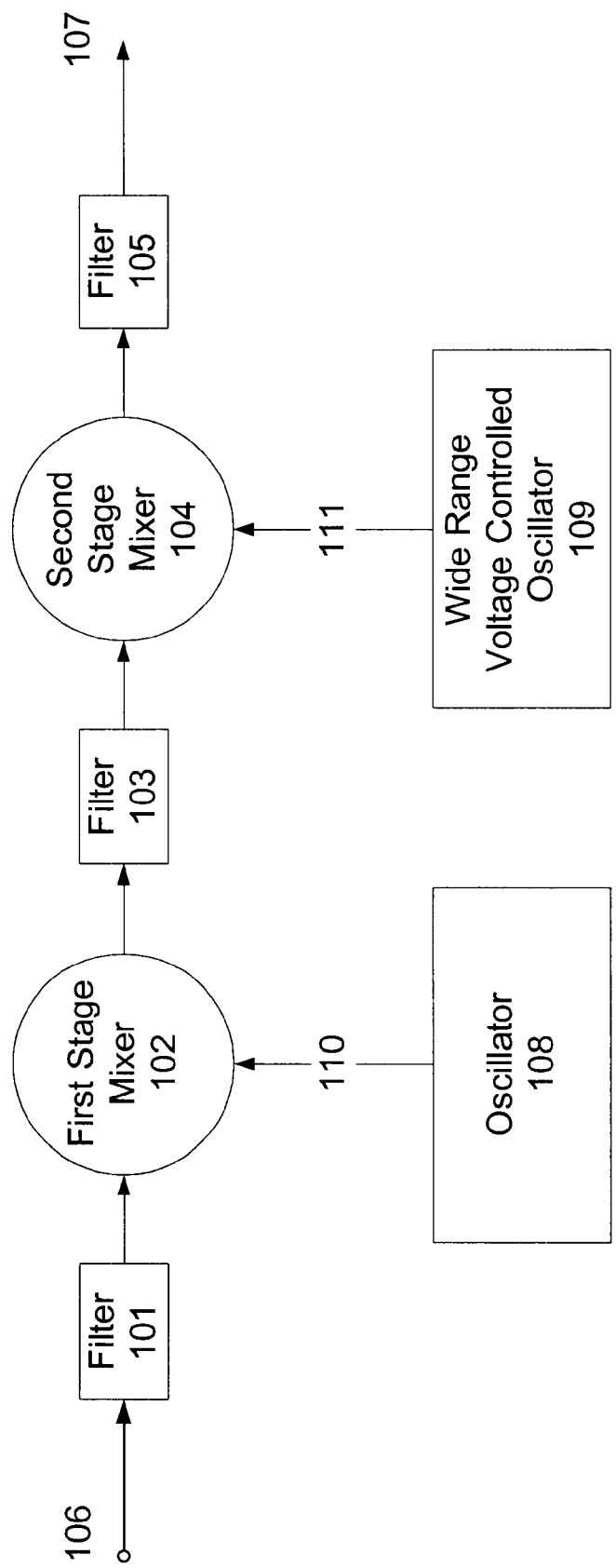
FIG. 1 is a block diagram of a conventional two-stage upconverter for upconverting an intermediate frequency signal in a cable television system to a higher transmission frequency.
Figure 2:
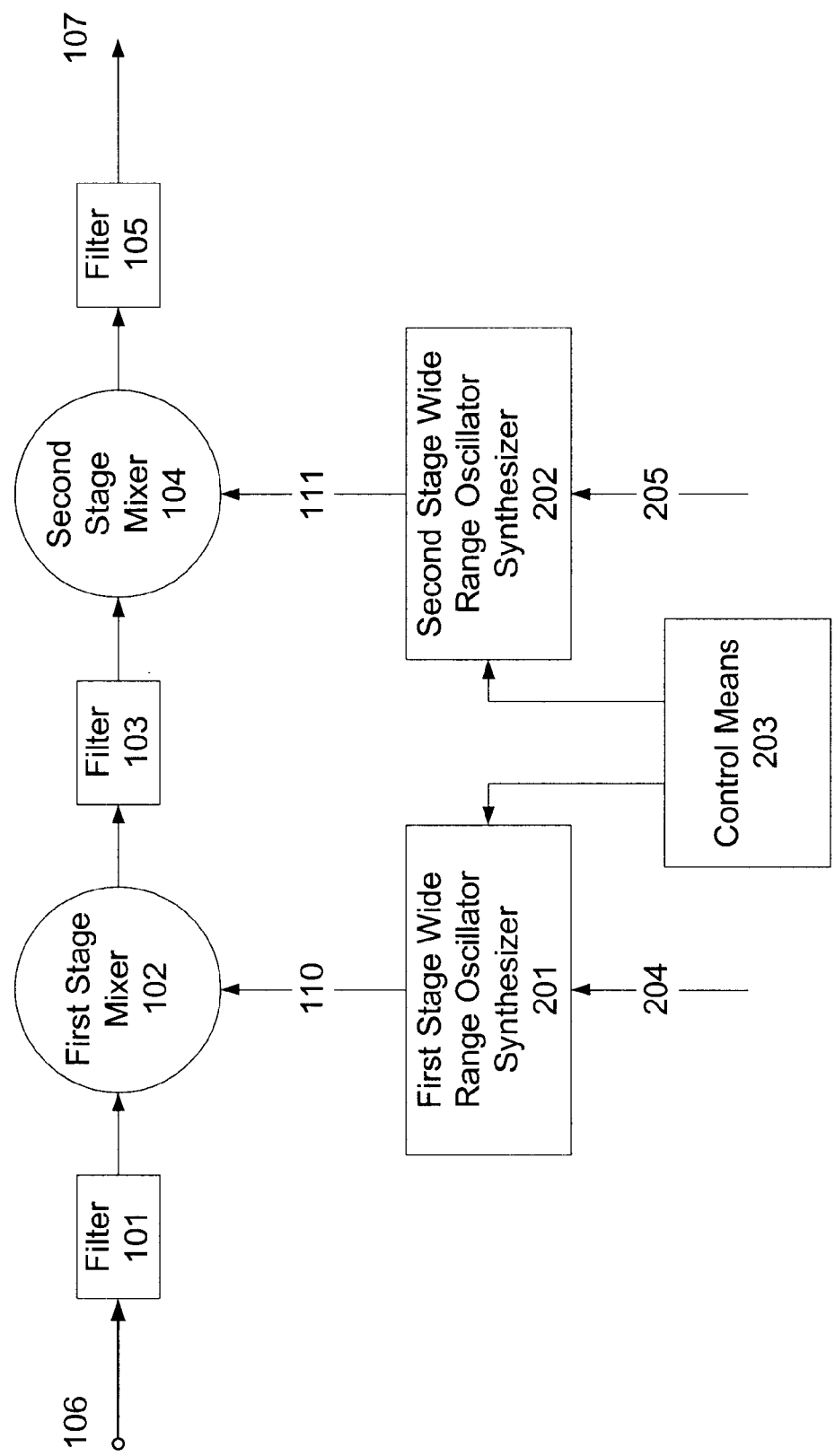
FIG. 2 is a block diagram of a second known two-stage upconverter for upconverting an intermediate frequency signal in a cable television system to a higher transmission frequency.
Figure 3:
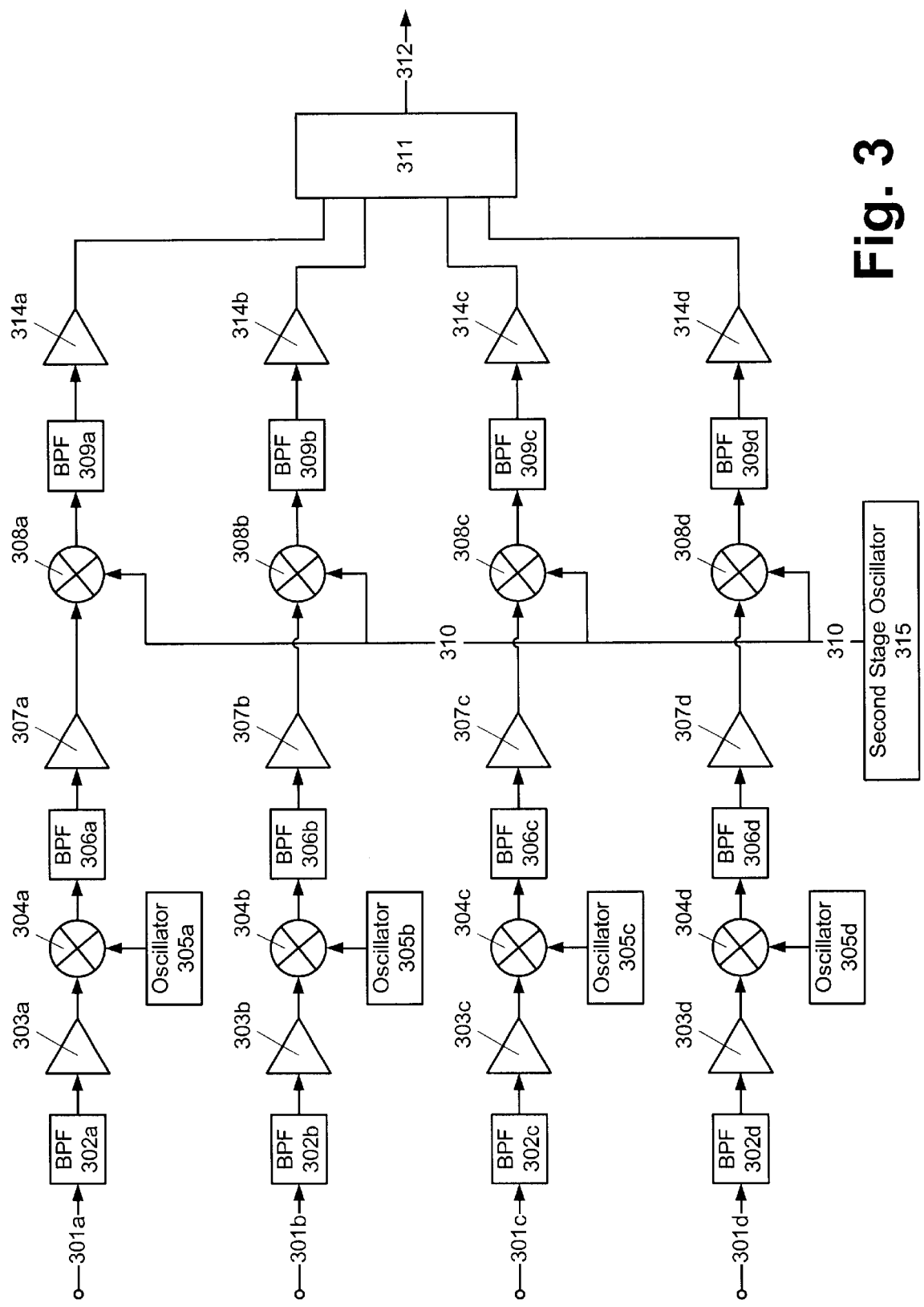
FIG. 3 is a block diagram of a multiple-channel, two-stage upconverter for upconverting an intermediate frequency signal in a cable television system to a higher transmission frequency according to the present invention.

FIG. 3 illustrates an improved two-stage upconverter according to the present invention. The upconverter of the present invention is a multiple channel upconverter, meaning that the unit upconverts signals for not just one, but for two or more channels being broadcast over the cable system. Preferably, the channels in the group processed by the upconverter of the present invention are adjacent channels as to frequency.

Many circuit elements in this field are designed, built and sold as dual elements, i.e., two identical independent circuits sold as a single unit, for example, dual synthesizer chips, two-port splitters and combiners, etc. Therefore, it is preferable for the upconverter of the present invention to process or upconvert an even number of channels. Accordingly, in the example shown in FIG. 3, the upconverter of the present invention may handle four channel inputs. However, as will be appreciated by those skilled in the art, an upconverter unit according to the present invention could be made to handle any number of channel inputs.

The example illustrated in FIG. 3 is exemplary only and not intended to limit the scope of the present invention. Under the principles of the present invention, for example, the upconverter shown in FIG. 3 could be reduced to handle two input channel signals or expanded to handle six input channel signals.

As shown in the example illustrated in FIG. 3, four channel input signals (301) are provided. Each of these channel signals is a modulated signal carrying a particular channel of television programming within the cable system. Each of the four channel signals (301) is an intermediate frequency signal. And, under the principles of the present invention, all the channel signals (301) may have the same frequency.

Each of the channel signals is initially filtered through a band pass filter (302). The band pass filter (302) passes only that intermediate frequency band in which the channel signal is supposed to reside, e.g. 44 MHz. After the band pass filter (302), each of the filtered channel signals (301) is amplified by an amplifier (303).

The amplified signals then enter the first-stage of the upconverter, i.e. first-stage mixers (304) and oscillators (305). A mixer (304) multiplies each of the channel signals (301) with a signal from a corresponding oscillator (305). Unlike previous two-stage upconverters, the oscillators (305) in the first-stage of the upconverter of the present invention do not provide a signal of the same frequency to the mixers (304). Rather, each oscillator (305) outputs a signal to a respective mixer (304) that is spaced as to frequency from signals output by the other oscillators (305) in the upconverter by the amount between channels in the cable television system. In other words, signals output by the first-stage mixers (304) have frequencies spaced at the same intervals as the spacing between different channel frequencies in the cable system.

For example, the first oscillator (305a) may output a 935 MHz signal. The mixer (304a) combines this with the 44 MHz IF channel signal (301a) and outputs a resulting signal at 1009 MHz. The second oscillator (305b) may output a 959 MHz signal. The mixer (304b) combines this with the 44 MHz IF channel signal (301b) and outputs a resulting signal at 1003 MHz. The third oscillator (305c) may output a 953 MHz signal. The mixer (304c) combines this with the 44 MHz IF channel signal (301c) and outputs a resulting signal at 997 MHz. The fourth oscillator (305d) may output a 947 MHz signal. The mixer (304d) combines this with the 44 MHz IF channel signal (301d) and outputs a resulting signal at 991 MHz.

It will be noted by those skilled in the art that the frequencies output by the first-stage oscillators (305) are not particularly important so long as they differ by the frequency difference between channels in the cable television system. Additionally, the oscillators (305) can be any oscillator or oscillator synthesizer capable of outputting a signal of a particular frequency. The oscillators (305) may be controlled by phase locked loops.

Economy and accuracy can be emphasized with the first-stage oscillators (305) of the present invention because those oscillators (305) do not need to be tunable or controlled to output a variety of different frequencies. Rather each oscillator (305) need only output a signal which remains spaced as to frequency relative to the signals output by the other oscillators (305) in the group by the amount of separation between different channel frequencies in the cable system. Therefore, the oscillators (305) need only have a limited tuning range to fine-tune the nominal output frequencies. Adjustment to the oscillators (305) is preferably in steps of only 0.25 MHz.

The channel signals (301), which are now of different frequencies spaced in accordance with the frequency spacing of different channels in the cable system, are again band pass filtered by filters (306). Each of these filters (306) will filter a respective channel signal (301) according to the channel band to which that signal (301) has been converted by the first-stage of the upconverter. Continuing the example given above, filter (306a) may filter the channel signal (301a) to a frequency band at 1009 Mhz. Filter (306b) may filter the channel signal (301b) to a frequency band at 1003 Mhz. Filter (306c) may filter the channel signal (301c) to a frequency band at 997 Mhz. Filter (306d) may filter the channel signal (301d) to a frequency band at 991 Mhz. After this additional band pass filtering, each of the channel signals (301) is amplified by a respective amplifier (307).

The filtered and amplified channel signals (301) are then input to the second-stage of the upconverter of the present invention. Each of the four signals (301) is input to a respective second mixer (308). Each of these mixers (308) receives a signal (310) from a second-stage oscillator (315). The same signal (310) from the second-stage oscillator (315) is used by each of the second-stage mixers (308).

The second-stage oscillator (315) can be, for example, a voltage controlled oscillator or an oscillator synthesizer. The first-stage mixers (304) and oscillators (305) spread the four channel input signals (301) with a frequency spacing equal to the spacing between channels in the cable television system. However, it is the signal (310) from the second-stage oscillator (315) that determines on which channels the four signals (301) will actually be transmitted. For example, by controlling the signal (310) from the second-stage oscillator (315), the four channel signals (301) may be transmitted as channels 2 to 5 or channels 12 to 15. This allows the system operator to use the upconverter of the present invention to provide the group of channels output by the upconverter anywhere over the available range of channels in the cable system.

Because, the second-stage oscillator (315) outputs a signal (310) that is used in generating an output signal for multiple, e.g., four, channels, the expense of the oscillator (315) can be spread over the four different channels, each of which would have required a separate second-stage oscillator in previous upconverter units. In this way, the second-stage oscillator (315) can be a relatively expensive and accurate unit without increasing the cost of providing the same total number of channels as compared with prior art upconverter systems. Moreover, the frequency step is increased by the number of channels, which allows for improved performance, especially in phase noise.

Preferably, the second-stage of the upconverter, decreases the frequency of the channel signals (301) output by the first-stage to provide channel signals at the desired broadcast frequencies in the VHF and UHF ranges. Extending the example given above, the signal (310) output by the second-stage oscillator (315) may be a 1464 MHz signal. Each of the mixers (308) subtractively combines the oscillator signal (310) with the respective channel signal (301) received by the mixer (308). Consequently, in the present example, the mixer (308a) receives the channel signal (301a) at 1009 MHz and outputs a VHF signal at 455 MHz. [1464 MHz (signal 315)–1009 MHz (signal 301a)=455 MHz]. The mixer (308b) receives the channel signal (301b) at 1003 MHz and outputs a VHF signal at 461 MHz. The mixer (308c) receives the channel signal (301c) at 997 MHz and outputs a VHF signal at 467 MHz. The mixer (308d) receives the channel signal (301d) at 991 MHz and outputs a VHF signal at 473 MHz.

The signals (301) output by each of the second-stage mixers (308) are again band pass filtered by a respective band pass filter (309). Each of these filters (309) will filter a respective channel signal (301) according to the channel band to which that signal (301) has been converted by the second-stage of the upconverter, i.e., mixers (308) and oscillator (315). Continuing the example given above, filter (308a) may filter the channel signal (301a) to a frequency band at 455 Mhz. Filter (308b) may filter the channel signal (301b) to a frequency band at 461 Mhz. Filter (308c) may filter the channel signal (301c) to a frequency band at 467 Mhz. Filter (308d) may filter the channel signal (301d) to a frequency band at 473 Mhz.

After this additional band pass filtering, each of the channel signals (301) is amplified by a respective amplifier (314). The outputs of the four amplifiers (314) are then combined by a combiner (311) into a composite television signal (312) containing all four the channels represented by the four channel signals (301). This composite signal (312) can then be further combined with the output of other upconverter units to create the final television signal for transmission over the cable system in which dozens or hundreds of channels are tunable by subscribers.

The upconverter of the present invention can be produced less expensively and requires less physical space that conventional upconverter units. Consequently, the upconverter of the present invention is ideally suited to providing a video-on-demand service in which a large number of upconverter units are required at the headend facility. Additionally, the upconverter of the present invention is capable of handling channel signals that are digital signals using quadrature amplitude modulation (QAM). Consequently, the video-on-demand service provided using the upconverter of the present invention can include the high picture and audio quality of a digital program.

The preceding description has been presented only to illustrate and describe the invention. It is not intended to be exhaustive or to limit the invention to any precise form disclosed. Many modifications and variations are possible in light of the above teaching.

For example, the various band pass filtering stages described above that include a respective band pass filter corresponding to each channel signal and that set to filter at the frequency to which that signal was converted by the preceding conversion stage. Alternatively, a single band pass filter may be used with a filtering band wide enough to pass the entire set of channel signals over the range of frequencies represented by those signals. This approach will reduce the cost of the upconverter, but may limit the number of channels a single unit according to the present invention can process.

The preferred embodiment was chosen and described in order to best explain the principles of the invention and its practical application. The preceding description is intended to enable others skilled in the art to best utilize the invention in various embodiments and with various modifications as are suited to the particular use contemplated. It is intended that the scope of the invention be defined by the following claims.

What is claimed is:

1. A multiple-channel, two stage upconverter for processing television channel signals prior to broadcast in a cable television system, the upconverter comprising:
   a plurality of inputs for receiving a corresponding plurality of channel signals at an intermediate frequency;
   a first stage comprising a plurality of mixers and oscillators, one mixer and oscillator being associated with and receiving each of said channel signals, wherein each of said oscillators outputs an oscillator signal having a frequency different from oscillator signals output by other first-stage oscillators, and further wherein each oscillator signal is mixed by an associated mixer with one of said channel signals;
   a second stage receiving said channel signals from said first stage, said second stage comprising a plurality of second-stage mixers each of which receives one of said channel signals from said first stage, wherein each of said second-stage mixers mixes a received channel signal with a second-stage oscillator signal output by a single second-stage oscillator which is connected to each of said second-stage mixers.

2. The upconverter of claim 1, wherein said oscillator signals output by said first-stage oscillators have frequencies that are spaced apart by an amount equal to the frequency spacing between different channels in said cable television system.

3. The upconverter of claim 1, wherein said intermediate frequency of said channel signals when received by said inputs is the same frequency for all of said channel signals.

4. The upconverter of claim 1, further comprising a band pass filtering and amplification stage between said first stage and said second stage.

5. The upconverter of claim 4, wherein said band pass filtering stage comprises a plurality of band pass filters each of which filters one of said channel signals at a particular frequency to which that channel signal has been converted by said first stage.

6. The upconverter of claim 1, further comprising a combiner for combining said plurality of channel signals output by said second stage into a composite signal for broadcast over said cable television system.

7. The upconverter of claim 6, further comprising a low pass filtering and amplification stage between said second stage and said combiner.

8. The upconverter of claim 7, wherein said low pass filtering stage comprises a plurality of band pass filters each of which filters one of said channel signals at a particular frequency to which that channel signal has been converted by said second stage.

9. The upconverter of claim 1, wherein said second-stage oscillator is controllable to control on which channels in the cable system the plurality of channel signals are broadcast.

10. The upconverter of claim 1, further comprising a band pass filtering and amplification stage between said inputs and said first stage.

11. A method of upconverting multiple television channel signals using a two stage technique prior to broadcast of the channel signals in a cable television system, the method comprising:

in a first stage, mixing each of said channel signals with one of a plurality of oscillator signals, wherein each of said oscillator signals has a frequency different other oscillator signals of said plurality of oscillator signals; and in a second stage, mixing each of said channel signals individually with a common second-stage oscillator signal.

12. The method of claim 11, further comprising spacing apart frequencies of said oscillator signals by an amount equal to the frequency spacing between different channels in said cable television system.

13. The method of claim 11, further comprising supplying all of said channel signals to said first stage with a common intermediate frequency.

14. The method of claim 11, further comprising band pass filtering and amplifying said channel signals between said first stage and said second stage.

15. The method of claim 14, wherein said band pass filtering further comprises band pass filtering each of said channel signals with a separate band pass filter at a particular frequency to which that channel signal has been converted by said first stage.

16. The method of claim 11, further comprising combining said plurality of channel signals output by said second stage into a composite signal for broadcast over said cable television system.

17. The method of claim 16, further comprising band pass filtering and amplifying said channel signals between said second stage and said combiner.

18. The method of claim 17, wherein said band pass filtering further comprises band pass filtering each of said channel signals with a separate band pass filter at a particular frequency to which that channel signal has been converted by said second stage.

19. The method of claim 11, further comprising controlling said second-stage oscillator to control on which channels in said cable system said plurality of channel signals are broadcast.

20. The method of claim 11, further comprising band pass filtering and amplifying said channel signals before inputting said channel signals to said first stage.

21. An upconverter for upconverting multiple television channel signals using a two stage technique prior to broadcast of the channel signals in a cable television system, the method comprising:

first means for converting said plurality of channel signals such that said channel signals each have a different frequency, wherein said frequencies of said channel signals are spaced by an amount equal to a frequency spacing between channels in said cable television system; and second means for converting said plurality of channel signals to frequencies at which channels are broadcast in said cable television system using a single, common oscillator signal.

\* \* \* \* \*